US011169726B2

(12) United States Patent
Klein (10) Patent No.: US 11,169,726 B2
(45) Date of Patent: Nov. 9, 2021

(54) POOL-LEVEL STORAGE MANAGEMENT

(71) Applicant: Toshiba Memory Corporation, Tokyo (JP)

(72) Inventor: Yaron Klein, Raanana (IL)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/130,740

(22) Filed: Sep. 13, 2018

(65) Prior Publication Data

US 2020/0089424 A1    Mar. 19, 2020

(51) Int. Cl.
*G06F 12/00* (2006.01)
*G06F 3/06* (2006.01)
*G11C 16/34* (2006.01)
*G06F 11/10* (2006.01)
*G11C 29/44* (2006.01)

(52) U.S. Cl.
CPC .......... *G06F 3/0649* (2013.01); *G06F 3/0605* (2013.01); *G06F 3/0614* (2013.01); *G06F 3/0683* (2013.01); *G06F 11/1076* (2013.01); *G11C 16/3418* (2013.01); *G11C 29/44* (2013.01)

(58) Field of Classification Search
CPC combination set(s) only.
See application file for complete search history.

(56) References Cited

U.S. PATENT DOCUMENTS

| | | |
|---|---|---|
| 2007/0263466 A1 | 11/2007 | Morishita et al. |
| 2009/0241010 A1 | 9/2009 | Yano et al. |
| 2012/0266177 A1 | 10/2012 | Kakeda et al. |
| 2015/0074454 A1* | 3/2015 | Tanaka ................ G06F 11/1662 714/6.23 |
| 2018/0364793 A1* | 12/2018 | Wang .................... G06F 1/3206 |

FOREIGN PATENT DOCUMENTS

WO    WO-2010/064327 A1    6/2010

OTHER PUBLICATIONS

Ferguson, Doug, Optical Storage The Future of Long Term Data Preservation, Hitachi Data Systems Federal Corporation, 2015 Data Storage Innovation Conference.
Harris, Robin, Facebook's advanced erasure codes, available at https://storagemojo.com/2013/06/21/facebooks-advanced-erasure-codes/, (Accessed Jun. 5, 2018).

(Continued)

*Primary Examiner* — Yong J Choe
(74) *Attorney, Agent, or Firm* — Foley & Lardner LLP (57) ABSTRACT

A method of managing data storage using a management device that includes determining respective status information for a plurality of storage devices, and calculating, based on the status information, a respective cost for each of the plurality of storage devices using a cost function that includes one or more parameters including at least one of: a program/erase (P/E) parameter, a block error state parameter, a block error level parameter, and a workload parameter. The method further includes selecting a destination storage device of the plurality of storage devices based on at least some of the calculated costs, and writing data to the destination storage device.

17 Claims, 6 Drawing Sheets

(56) References Cited

OTHER PUBLICATIONS

Plank, James S., Erasure Codes for Storage Systems, USENIX, vol. 38, No. 6, Dec. 2013.
White Paper, Optical Disc Data Archiving A New Age of Cold Data, Panasonic Corporation Connected Solutions Company, Jul. 1, 2017.
International Search Report and Written Opinion for corresponding International Patent Application No. PCT/IB2019/057593, dated Jan. 7, 2020, 8 pages.

* cited by examiner

POOL-LEVEL STORAGE MANAGEMENT

TECHNICAL FIELD

The present disclosure generally relates to systems and methods for storage management of a plurality of storage devices, including for cold storage applications.

BACKGROUND

Cold data storage refers to the storage of inactive data that is rarely used or accessed. Cold data may be retained for business or compliance purposes on a long-term basis. Cold data storage can employ more economical storage than high performance primary storage used to support more active data. For example, posted videos and photographs in social networks are frequently accessed right after they have been uploaded, but that frequency of access drops off dramatically within a few days. Such data, with low access rates, can be referred to as "cold data." Cold data can be moved for long-term storage into what are called "cold archives."

Storage facilities implement storage media such as hard disk drives (HDDs), optical discs, and tapes. Longevity of data storage can be affected by the structure and the quality of the materials of the storage media in addition to environmental factors. This creates a difference in the longevity of storage (e.g. less than 5 years for HDDs, and 10 to 30 years for tapes). HDDs employ a system that combines a mechanical drive and recording media, and the longevity of these drives is generally short. Tape systems utilize long rolls of ultra-thin (several micrometers (μm)) film which is prone to breakage. Optical discs utilize physical changes to non-organic material, and this media has a longer storage capability than HDDs or tapes. However, recording data on optical disks has practical and economical disadvantages: optical discs can be prohibitively costly, and reading data from optical disks can be impractical (e.g. require compatible optical disk readers). Furthermore, using long term storage media such as optical disks may be impractical because systems or devices to activate the long term storage media (e.g. read from, or write to, the long term storage media) may become obsolete and may not be readily available. For example, optical readers may become obsolete or less prevalent, and it may be difficult to purchase, manufacture or otherwise procure the optical readers needed to activate the long term storage media. Thus, there is a need for improved data storage, including for cold data storage and long term data storage.

BRIEF DESCRIPTION

One or more embodiments described herein address at least these issues. One way of storing cold data is by maintaining it in a "living system" using drives such as HDDs or solid state drives (SSDs), and continually migrating the data over time, while adding incoming new cold data.

Backup and archiving applications are used in data centers to maintain cold and frozen data. These applications are often characterized with a single write stream (no update and zero or low read load). Due to the workload nature, a low number of program/erase (P/E) cycles may be implemented over the lifetime of the cold storage device. That is, device writes per day (DWPD) requirement may correspond to 1 disk write per few years. HDDs, which can have lower performance than SSDs (e.g. with regard to density, power consumption, cooling, and accessibility), may nonetheless be less costly than SSDs. Thus, because of low performance requirements for cold storage, HDDs are typically implemented. This fails to provide a storage system with many of SSD's advantages.

Some specifications for the physical characteristics for storage media include the following: minimal cost, a tamperproof recording method, a non-volatile memory, a long useful life (e.g. of 100 years or more), compatibility with various systems, and random access capability.

Unlike HDD media, SSDs, which may include NAND memory, are limited in their write capabilities. That is, they have finite P/E cycles before the memory begins to deteriorate and ultimately fail. As a result they may be provided with a limited warranty (e.g., three or five years for a given workload set with DWPD). Often, overprovisioning (OP) is calculated a-priori such that with the required DWPD workload, remaining P/E cycles at the end of the warranty period will be less than a media-limited number of P/E cycles. As OP is set for worst case scenarios, usually devices remain with hundreds or thousands of P/E cycles remaining with regard to media limitations. For example, if a media P/E limit is 10K, it may arrive at end of life (or end of warranty) with about 7K-8K consumed, leaving 2K-3K P/E left.

Further to limited P/E cycles, NAND media wear-out may increase a read error rate. That is, at the end of warranty time the probability for read error is larger than for new media. An SSD controller can adapt its error correction algorithm for the media state, such as from a hard decision to a soft decision, or adapting an internal redundant array of independent disks (RAID) structure. This affects the read latency (e.g. because a more complex algorithm is used that involves more computation time) and may even cause a block to be removed from a pool of blocks and labelled as a bad block.

Some approaches to enabling communication with a NAND flash package include the use of serial protocols, such as MMC (Multi Media Card) and SPI (Serial Peripheral Interface), but these are limited to low speed applications in flash memory for consumer devices such as mobile phones, tablets and cameras. These protocols are not suitable for high speed applications such as the use of NAND flash memory devices in SSDs.

However, despite these limitations, there are advantages to using SSDs in large scale data storage systems. Expired SSDs or SSDs with low remaining P/E capacity may be inexpensive, and operating expenses of SSDs can be lower as compared to HDDs due to SSD characteristics such as improved density, power consumption and cooling. Systems and methods described herein provide for making use of SSDs (e.g. including expired SSDs or SSDs with low remaining P/E capacity) for backup and archiving platforms, and provide for migration and archiving processes that make effective use of SSDs while minimizing risk that an operational SSD will fail.

Conventionally, storage device malfunctions are anticipated and managed at the device-level (e.g. on an individual basis). For example, in certain conventional systems, a storage device may be assumed to be functional up until a certain point (e.g. up until a number of P/E cycles corresponding to a warranty limit are performed), and the storage device may be deactivated once that point is reached, or somewhat before that point is reached. However, such deactivation does not make use of pool-level information regarding relative reliability of devices for deactivation of relatively low priority storage devices, and transfer of data to relatively high priority storage devices. Such pool-level management allows for additional granularity in selection of devices and provides for improved management that makes effective use of storage devices that may be past a warranty point.

In one or more embodiments, according to a first aspect, a method of managing data storage using a management device includes determining respective status information for a plurality (i.e. pool) of storage devices, and calculating, based on the status information, a respective cost for each of the plurality of storage devices using a cost function that includes one or more parameters including at least one of: a program/erase (P/E) parameter, a block error state parameter, a block error level parameter, and a workload parameter. The method further includes selecting a destination storage device of the plurality of storage devices based on at least some of the calculated costs, and writing data to the destination storage device.

In one or more embodiments, according to a second aspect, a method of managing data storage includes selecting a source storage device of a plurality of storage devices, reading data from the source storage device, determining that the read data is corrupted, and selecting a destination storage device of the plurality of storage devices based on a cost for the destination storage device calculated using a cost function. The method further includes determining error-corrected or error-free data based on the corrupted read data and writing the error-corrected or error-free data to the selected destination storage device. The cost function includes one or more parameters including at least one of: a program/erase (P/E) parameter, a block error state parameter, a block error level parameter, and a workload parameter.

In one or more embodiments, according to a third aspect, a system for managing data storage includes a plurality of storage devices and a management device. The management device is configured to determine respective status information for a plurality of storage devices, calculate, based on the status information, a respective cost for each of the plurality of storage devices using a cost function, and determine a ranking for the plurality of storage devices based on the calculated costs. The management device is further configured to select a destination storage device of the plurality of storage devices based on the ranking, and write data to the destination storage device. The cost function includes one or more parameters including at least one of: a program/erase (P/E) parameter, a block error state parameter, a block error level parameter, and a workload parameter.

DETAILED DESCRIPTION

The embodiments described herein provide for certain improvements to devices or methods for a data storage system. One or more of the embodiments described herein implement low-cost expired SSDs or SSDs with low remaining P/E capacity. Certain issues with SSDs, such as data corruption and risk of drive failure, can be mitigated or solved using the devices or methods described herein, which include management devices configured to perform improved selection of SSDs for archiving new data or for migrating existing (possibly error-corrected) data. The improved selection may be based on a cost function that accounts for characteristics of candidate SSDs included in a pool of SSDs being managed by the management device. The management device may also flag and/or remove SSDs that are unreliable (e.g. as evidenced by a cost of the unreliable device being at, above, or below a cost threshold).

Figure 1:
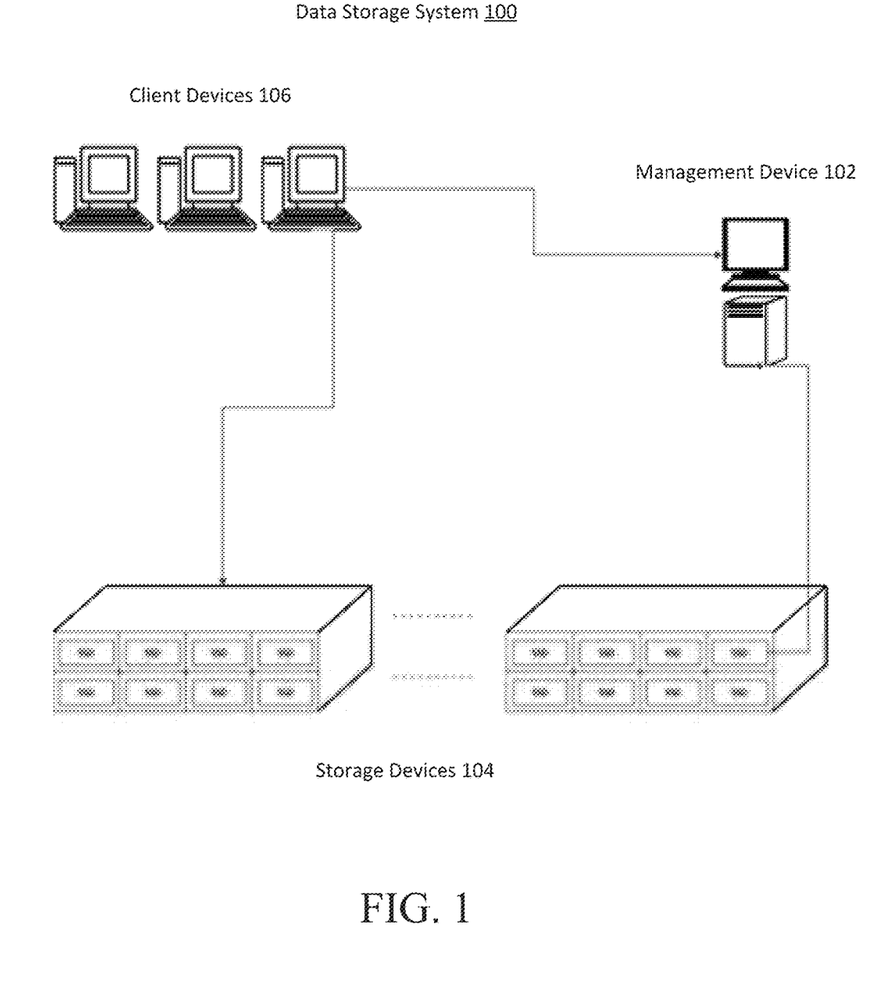
FIG. 1 shows an overview of an example data storage system according to embodiments of the present disclosure.

FIG. 1 shows an overview of an example data storage system 100 according to embodiments of the present disclosure. The data storage system 100 can include a management device 102, a plurality of storage devices 104, and one or more client devices 106. The management device 102, the plurality of storage devices 104, and the one or more client devices 106 are communicatively connected.

The management device 102 may be configured to perform pool-level management of the storage devices 104, including selectively storing data in appropriate storage devices of the storage devices 104 and including flagging or inactivating storage devices deemed unreliable. The management device 102 may provide access to one or more application programming interfaces (APIs) to the client devices 106 for accessing, monitoring, or manipulating data stored in the storage devices 104. The APIs can provide for block-level, object-level, or file-level management. An example management device 102 is described in more detail below with respect to FIG. 2.

The storage devices 104 may include memory devices such as SSDs. For example, the storage devices 104 include SSDs that are expired (e.g. beyond their warranty period with respect to P/E), or SSDs with low remaining P/E capacity. Such SSDs may be low cost and may be unusable or inefficient in conventional storage systems. In some embodiments, the storage devices 104 may also include SSDs that are not expired, and may include HDDs or other storage media.

The client devices 106 may be hosts, servers or other devices configured to transmit data for cold storage. For example, the client devices 106 may be configured to migrate data that has expired (e.g. has been inactive for a predetermined period of time, or has been accessed with a low frequency for the predetermined period of time) to the storage devices 104. The client devices 106 may send the data to be stored to the management device 102 for storage in the storage devices 104, or may query the management device 102 for locations within the storage devices 104 in which the client devices 106 may store the data directly. In some implementations, the client devices 106 may be configured to store information directly in the storage devices 104 and may send an indication of such storage to the management device 102. The client devices 106 may perform such management using the APIs provided by the management device 102.

Figure 2:
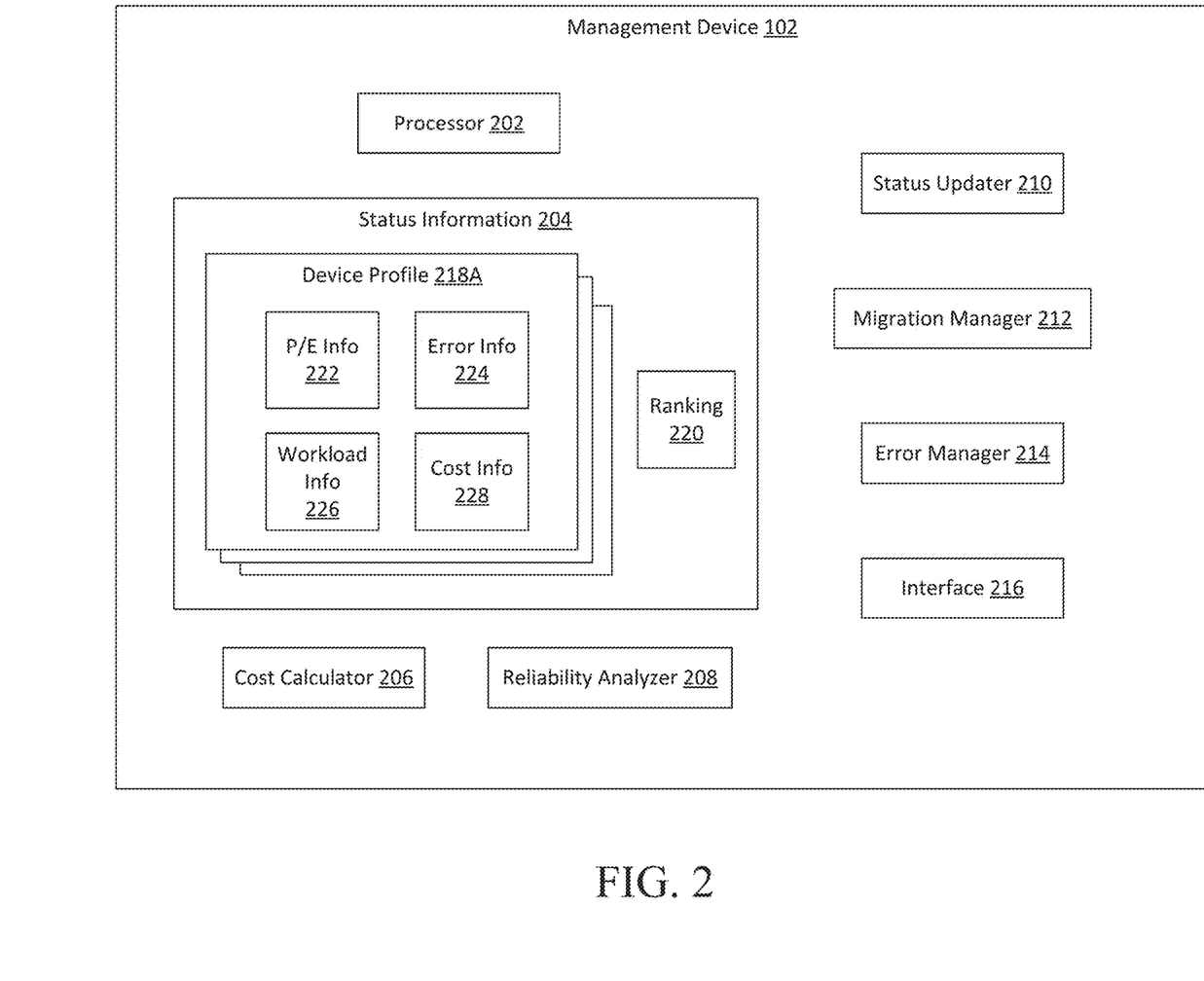
FIG. 2 is a block diagram of an example management device for managing the data storage system shown in FIG. 1, according to embodiments of the present disclosure.

FIG. 2 is a block diagram of an example management device 102 according to embodiments of the present disclosure. The management device 102 includes a processor 202, status information 204, a cost calculator 206, a reliability analyzer 208, a status updater 210, a migration manager 212, an error manager 214, and an interface 216. The management device 102 may be configured to selectively store data in appropriate storage devices of the storage devices 104 and to flag or inactive storage devices deemed unreliable.

The processor 202 may include one or more microprocessors, application-specific integrated circuits (ASICs), a field-programmable gate array (FPGA), etc., or combinations thereof. The processor may be configured to execute firmware, software, and instructions stored in memory (on machine-readable media), such as instructions included in the components of the management device 102 described herein.

The status information 204 may be information stored in memory of the management device 102. The status information 204 may include a plurality of device profiles 218 that respectively correspond to the plurality of storage devices 104. The plurality of device profiles 218 may include any number of device profiles, and include at least a first device profile 218A. The status information also includes a ranking 220.

The device profile 218A includes status information about the storage devices 104, including one or more of PIE information 222, error information 224, workload information 226, and cost information 228. The device profile 218A may also include bad block data that can indicate whether one or more blocks of the corresponding storage device 104 are bad or unreliable. The status information can be used by components of the management device 102 to manage archiving and migration of data stored in the storage system 100. For example, the status information can be used to identify storage devices 104 that are unreliable (e.g. are error-prone, or are unlikely to maintain stored data in an uncorrupted state), and to migrate data from the unreliable storage devices 104 to reliable storage devices 104. The status information can also be used for other purposes, such as wear-leveling.

The P/E information 222 can pertain to one or more, or all, of the storage devices 104. The P/E information 222 may indicate a number of P/E cycles that have been performed on a storage device 104, a media limit on the number of P/E cycles for the storage device 104, or a remaining number of P/E cycles of the storage device 104, for example. The P/E information 222 may include information specific to one or more memory blocks of the storage device 104 (which may be referred to herein simply as "blocks"), and may include averages calculated across blocks of the storage device 104 (e.g. average number of P/E cycles per block). As described in more detail herein, the P/E information 222 can be used as an input to a cost function for determining a reliability, priority, or ranking of storage devices of the storage devices 104.

The error information 224 can pertain to an error state or an error level of the storage devices 104. The error information 224 can include error state information that indicates a "state" of a storage device 104 or of a block of the storage device 104 that corresponds to one or more error correction techniques, or a category of such technique (e.g. low level error correction or high level error correction). For example, error correction processes for a block at a high error level may be require complex algorithms (e.g. relative to those used for a block in a low error state) that use more computing resources and/or take more time to implement. The error state can be determined based on a degree and/or type of corruption of data of the storage device 104, or can be determined based on results of attempted error correction using particular error correction techniques. In some embodiments, the error state information can be used to directly flag a storage device 104 as unreliable.

The error information 224 can also include error level information that indicates a frequency or likelihood of read data errors, programming errors or bad block errors for a storage device 104 or for a block of the storage device 104. The error information 224 can indicate, for example, an average number of uses or amount of time between errors that require correction, or can indicate an average number of errors for a given time period or for a given number of uses. The error information 224 can include histograms of the error level information or of the error state information. As described in more detail herein, the error information 224 can be used as an input to a cost function for determining a reliability, priority, or ranking of storage devices of the storage devices 104.

The workload information 226 can pertain to a frequency or likelihood of use of the storage devices 104, or in some embodiments, a frequency or likelihood of use of specific blocks of the storage devices 104. Use of the storage devices 104 can include accessing the storage devices 104 for read or write processes. In cold storage systems use of storage devices is generally low, but may still vary from device to device. In some embodiments, a higher frequency or likelihood of use for a storage device 104 may indicate that a higher threshold for an acceptable error level may be implemented, as error rates generally increase as retention time increases, which is inversely proportional to the frequency of use. In contrast, a lower frequency or likelihood of use for a storage device 104 may dictate that a lower threshold for an acceptable error level should be implemented. In other embodiments, a higher frequency or likelihood of use for a storage device 104 may indicate that a higher threshold for an acceptable error level should be implemented, as storage devices 104 having a higher error level may implement more time consuming, complex error correction algorithms for each use, which can amount to a significant (and perhaps unacceptable) access time delay for high-use and high-priority storage devices 104. In such embodiments, a lower frequency or likelihood of use for a storage device 104 may indicate that a lower threshold for an acceptable error level should be implemented, as the time-consuming error correction processes will only be implemented infrequently for the infrequently accessed data. As described in more detail herein, the workload information 226 can be used as an input to a cost function for determining a reliability, priority, or ranking of storage devices of the storage devices 104. The cost function may output a "cost" that is an aggregation of a "reliability" value based on one or more reliability parameters (such as P/E parameters or error parameters) and a "workload" value based on one or more workload parameters (such as the workload parameter discussed herein, or another parameter indicating a frequency of use).

The cost information 228 can pertain to a "cost" of the storage devices 104. The cost can be determined using a cost function determined by the cost calculator 206, as described in more detail herein. The cost can indicate a reliability, priority, or rank of a storage device 104. In certain embodiments described herein, a cost function may be described as outputting a high number for a relatively reliable storage device 104 that is relatively less error-prone, and outputting a low number for a relatively unreliable storage device 104 that is relatively more error-prone. Correspondingly, a high cost storage device 104 may refer to a relatively reliable storage device 104 that is relatively less prone to data errors than a low cost storage device 104. However, in other embodiments the cost function may output a high number for low reliability devices and a low number for high reliability devices.

The cost calculator 206 may include logic, hardware, or firmware for calculating a cost for a storage device 104 using a cost function. As described above, the cost may indicate reliability, priority, or rank of the storage device 104. The cost may indicate a suitability of a storage device 104 for storing information (e.g. new information, or information being migrated from another storage device 104). The cost may indicate whether a storage device 104 is sufficiently reliable to include in a pool of reliable storage devices 104, or whether the storage device 104 should be flagged as unreliable, inactivated, and removed from the pool of reliable storage devices 104. The cost may be calculated using a cost function. The cost function may use as inputs any of the P/E information 222, the error information 224, and the workload information 226, and any other appropriate information. In some embodiments, the cost function is a linear function or includes a linear component. For example, the cost function may be of the form, or may include a term of the form:

$$\text{cost} = w_{P/E} \cdot P/E + w_{state} \cdot ES + w_{error} \cdot EL + w_{utilization} \cdot \text{WORK};$$

where P/E is a program/erase parameter, ES is an error state parameter, EL is an error level parameter, WORK is a workload parameter, and $w_{P/E}$, $w_{state}$, $w_{error}$, and $w_{work}$ are corresponding weights. The weights for the cost function can be predetermined weights. In some embodiments, the weights can be manually input by a user of the management device 102. In some embodiments, the weights can be determined by the management device 102.

The P/E parameter can relate to any of the P/E information 222, and may be a number of P/E cycles that have been performed on a storage device 104, a media limit on the number of P/E cycles for the storage device 104, a remaining number of P/E cycles of the storage device 104. In some embodiments the P/E parameter may indicate a "level" of remaining P/E cycles with respect to a media limit (e.g. many cycles remaining, some cycles remaining, or few cycles remaining) defined by one or more predetermined thresholds. The P/E parameter may indicate relative P/E information (e.g. a difference in P/E cycles performed, or P/E cycles remaining, relative to other block or other storage devices 104). By incorporating such a P/E parameter into the cost function, the cost function may provide for wear-leveling. The P/E parameter can be an average of P/E parameter for a plurality of blocks of the target storage device 104 for which the cost function is being calculated.

The ES parameter can relate to any of the error state information of the error information 224, and may indicate an error correction technique or a category of error correction techniques suggested or suited for a given level of corruption or type of corruption of data stored in the target device. The ES parameter can be an average of ES parameters for a plurality of blocks of the target storage device 104 for which the cost function is being calculated.

The EL parameter can relate to any of the error level information of the error information 224, and can indicate a frequency or likelihood of error of data for the data stored in the storage device 104 or for a block of the storage device 104. The EL parameter can be an average number of uses or amount of time between errors that require correction, or can indicate an average number of errors for a given time period or for a given number of uses. The EL parameter may be specific to errors at the error level indicated by the ES parameter, or can pertain to a plurality of error levels. The EL parameter can be an average of EL parameters for a plurality of blocks of the target storage device 104 for which the cost function is being calculated.

The WORK parameter can relate to any of the workload information 226, and can be a parameter that indicates a likelihood or frequency of use of the target storage devices 104 for which the cost function is being calculated. The WORK parameter can indicate a number of uses in a given period of time (e.g. an average number of uses over a predetermined period). The number of uses may be calculated as a weighted sum of read uses and write uses, and in some embodiments the write uses may be more heavily weighted than the read uses. By incorporating the WORK parameter in the cost function, the cost function may provide for identifying data that should be migrated to reduce the likelihood of read disturb errors, or errors or loss of data due to retention errors, programming errors or bad block errors. The cost function may thus also account for high write amplification (WA) in frequently accessed devices, and for degraded write performance. The WORK parameter can be an average of WORK parameters for a plurality of blocks of the target storage device 104 for which the cost function is being calculated.

In addition to calculating the cost for target storage devices 104 and determining the cost information 228, the cost calculator 206 may determine the ranking 220 based on the cost information 228. The ranking may be a strictly hierarchical ranking that ranks the storage devices 104 from highest cost to lowest cost (or from lowest cost to highest cost). The ranking 220 may correspond to, or be, a ranking of priority or preference for the storage devices 104, and may be used to determine destination storage devices 104 for data migration or data archiving processes.

The reliability analyzer 208 may include logic, hardware, or firmware for determining a reliability of the storage devices 104. The reliability may include a reliability score, a reliability level, or a binary reliability (reliable/unreliable) determined for the storage devices 104. The reliability analyzer 208 may use one or more cost thresholds to determine the reliability of the storage devices 104. In some embodiments, the reliability analyzer can flag a storage device as unreliable (e.g. having a cost below a cost threshold), and can generate or cause an alert to be issued (e.g. to a user of the management device 102) that indicates that the storage device is unreliable and/or that the storage device should be removed from the pool of storage devices 104. The one or more cost thresholds used by the reliability analyzer 208 can be predetermined (e.g. can be manually set by a user of the management device 102).

The status updater 210 may include logic, hardware, or firmware for generating, updating, or otherwise determining the status information 204. The status updater can determine the status information 204 according to a predetermined schedule (e.g. every twenty-four hours, or every fourth-eight hours), and/or can determine the status information 204 when a triggering event occurs (e.g. when data is newly archived in one or more of the storage devices 104, when one or more data migration processes are performed, when a storage device 104 is removed from, or added to, the pool of storage devices 104, or when a user of the management device 102 triggers a status update). The status updater 210 may be notified when a P/E cycle or an error correction process is performed on a storage device 104, or when a storage device 104 is otherwise accessed, and the status updater 210 updates the status information 204 accordingly. In some embodiments the status updater 210 can query the storage devices 104 (or a corresponding controller) for the status information 204. In some embodiments, the storage devices 104 (or a corresponding controller) may initiate a status update by transmitting statue information 204 to the status updater 210 without the status updater 210 requesting the information. In some embodiments, the statutes updater 210 may update costs for the storage devices 104 by directing the cost calculator 206 to determine updated costs. The status updater may similarly update the ranking 220 based on updated costs.

The migration manager 212 may include logic, hardware, or firmware for migrating data stored on the storage devices 104. The migration manager 212 may implement migration processes that include migrating data from unreliable storage devices 104 to reliable storage devices 104. For example, responsive to a trigger (e.g. a storage device 104 being flagged as unreliable, or a user command to perform storage device cleanup), or according to a schedule, the migration manager 212 may select a source storage device 104 that is flagged as unreliable, may select a destination storage device 104 that is reliable, and may transfer some or all of the data from the source storage device 104 to the destination storage device 104. The migration manager 212 may implement a pool-level selection process that includes selecting a high priority storage device 104 as the destination storage device based on the cost of the storage device 104, or based on the ranking 220. In some embodiments the migration manager 212 may select the highest priority available storage device 104 of the pool of storage devise 104 as the destination storage device 104. An available storage device 104 may be, for example, a storage device 104 that has enough free memory to store the data to be transferred from the source storage device 104, or that is otherwise logistically suitable to store the transferred data.

In some embodiments, the migration manager 212 may migrate data to implement a refresh protocol to reduce the likelihood of read disturb errors, or errors or loss of data due to retention errors, programming errors or bad block errors, or any kind of load balancing for the data storage system 100. For example, the migration manager 212 may determine that a predetermined number of reads have occurred for a source storage device 104, and may flag the source storage device for migration to prevent read disturb. As another example, the migration manager 212 may determine that a source storage device may contain data that has been stored, but not read, for a period of time that exceeds a threshold retention time and may flag the data in the source storage device for migration to prevent retention errors. The migration manager may migrate data stored in the flagged source storage device 104 to a selected destination storage device 104. The destination storage device 104 may be selected using the pool-level selection process described above.

In some embodiments, the migration manager 212 may implement backup or data protection against errors using encoding or redundancy processes for data stored in the storage devices 104. For example, the storage devices 104 may implement an erasure coding protocol managed by the management device 102, where data is encoded with redundancy into multiple data chunks before being stored as a stripe of chunks across multiple storage devices 104, wherein the successful reading of only a subset of the chunks is required to recover the data. In another example, the storage devices 104 may implement a data redundancy or parity protection scheme such as a RAID (redundant array of independent disks) system (e.g. RAID 0 data striping, RAID 1 mirroring, RAID 5 or RAID 6 parity protection). In yet another example, the management device 102 may implement a Reed-Solomon error correction encoding system. Mirroring or other data protection by encoding redundancy functions, such as those used in the erasure coding protocol or RAID systems, may be implemented using the pool level selection process described above. For example, selection of storage devices 104 on which to store RAID or erasure encoded stripes of data comprising one or more data chunks that together constitute a stripe of data may be performed using the pool level selection process.

In some embodiments, the migration manager 212 may perform archiving functions for new data to be stored. The client devices 106 may transmit data to be stored to the management device 102 or, via an API described below, directly to the storage devices 104. The management device 102 or the API selects a destination storage device 104 using the pool-level selection process described above, and the data is stored in the selected storage device 104. In some embodiments, the data is stored in a device that does not have a device profile 218, and the status updater 210 generates a new device profile 218 for the device.

The migration manager 212 may perform migration as part of an error correction protocol that uses the error manager 214. The error manager 214 may include logic, hardware, or firmware for performing error correction of data stored on the storage device 104. For example, the error manager 214 may implement Reed Solomon encoding that stores data with additional parity protection bits. The error manager 214 may read the data and parity protection bits, and may determine that the read data is corrupted. The error manager 214 may determine that the corrupted data should be corrected, and may determine corresponding error-corrected data by Reed Solomon decoding the data and parity protection bits. In some embodiments, the migration manager 212 may determine whether the error-corrected data can be rewritten to a same storage device 104 on which the corrupted data was stored, or whether the error-corrected should be stored on a different storage device 104. The migration manager 212 may make this determination by referencing a cost of the storage device 104 on which the corrupted data was stored, and determining whether the cost is above a cost threshold (which may be the same as a cost threshold used by the reliability analyzer 208 in determining whether a storage device is reliable, or which may be a different cost threshold). If the migration manger 212 determines to write the error-corrected data to a new storage device 104, the migration manger 212 may implement the pool-level selection process to determine the destination storage device 104.

The migration manager 212 may perform migration as part of an error recovery protocol that uses the error manager 214. The error manager 214 may include logic, hardware, or firmware for performing error recovery of data stored on the storage devices 104. For example, the error manager 214 may implement erasure coding that stores data with in redundant form by erasure encoding into a set of multiple chunks that are stored as a stripe across a set of multiple storage devices 104. The error manager 214 may read the data chunks, and may encounter unrecoverable errors when reading particular data chunks from particular storage devices 104. The error manager 214 may then recover error-free data by reading without error a sufficient subset of the multiple chunks in the stripe. In some embodiments, the migration manager 212 may determine whether the recovered error-free data should be rewritten to a different set of multiple storage devices 104, avoiding the particular storage devices 104 which gave unrecoverable errors when reading, or whether the error-free data may be stored on the same set of multiple storage devices 104. The migration manager 212 may make this determination be referencing a cost of the storage devices 104 which gave unrecoverable errors when reading, and determining whether the cost is above a cost threshold (which may be the same as a cost threshold used by the reliability analyzer 208 in determining whether a storage device is reliable, or which may be a different cost threshold). If the migration manger 212 determines to write the error-free data to a new set of storage devices 104, the migration manger 212 may implement the pool-level selection process to determine the destination set of storage devices 104.

The interface 216 may include logic, hardware, or firmware for communicating with the client devices 106 and the storage device 104. The interface 216 may be integrated with an API provided by the management device 102 that allows the client devices 106 to store data in the storage devices 104 (e.g. directly, or indirectly via the management device 102).

Thus configured, the example storage system 100 makes use of pool-level information regarding relative reliability of devices for deactivation of relatively low priority storage devices, and transfer of data to relatively high priority storage devices. Such pool-level management allows for additional granularity in selection of devices and provides for improved management that makes effective use of storage devices that may be past a warranty point. The storage system 100 also provides for a type of holistic wear-leveling that goes beyond simply evening out of the storage devices, and provides for using high functionality storage devices 104 before using lower functionality storage devices 104, functionality being determined according to the above-described cost function that incorporates more factors, or alternative factors, than simply a number of P/E cycles that have been implemented.

Figure 3:
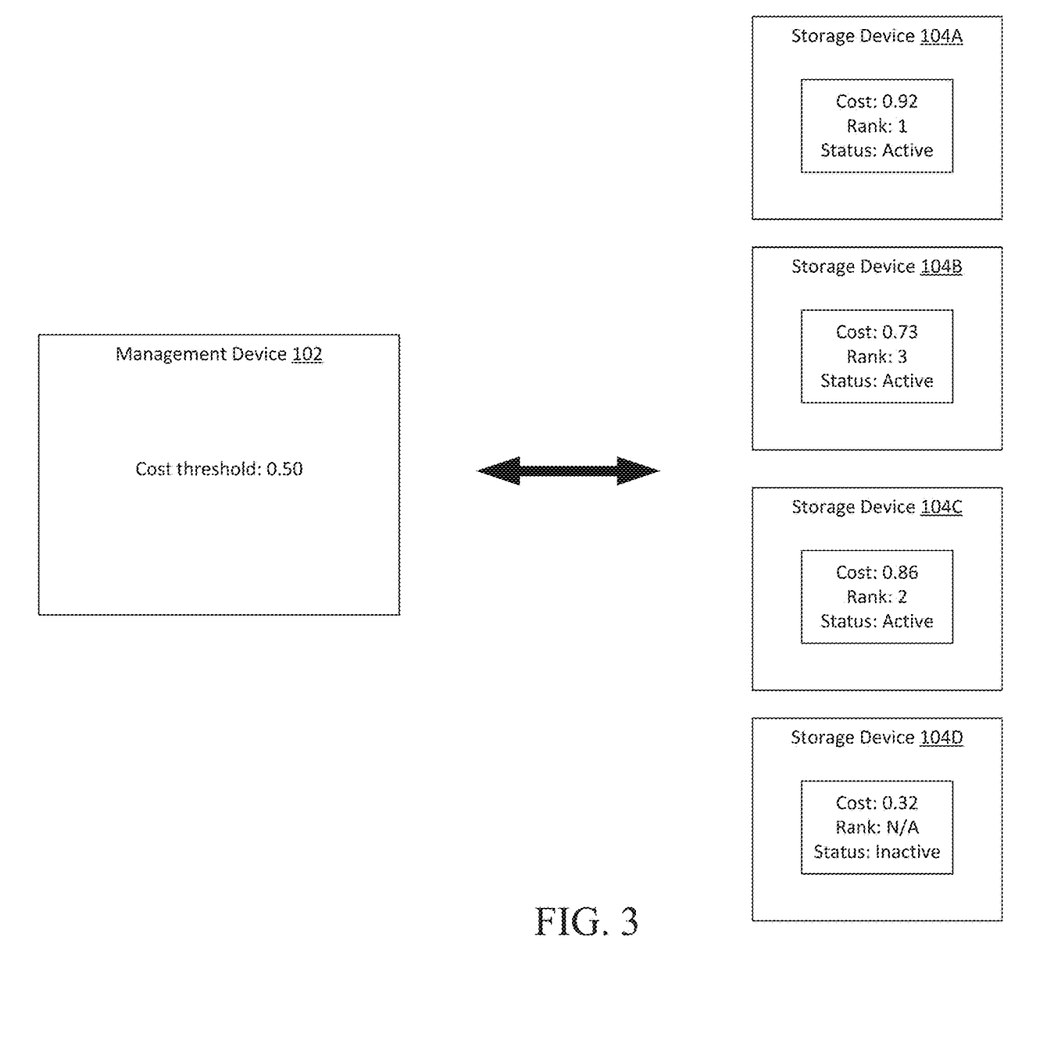
FIG. 3 shows a plurality of storage devices and their cost ranking according to embodiments of the present disclosure.

Referring now to FIG. 3, FIG. 3 shows a plurality of storage devices and their cost ranking according to embodiments of the present disclosure. FIG. 3 shows an example management device 102 configured to acquire status information 204 from a plurality of storage devices 104 including storage device 104A, 104B, 104C, and 104D. The management device 102 can use a cost calculator 206 to determine a cost for each of the storage devices 104A through 104D based on the status information 204, and to determine a rank for each storage device 104 based on the cost. The management device 102 can use a reliability analyzer 208 to determine whether any of the storage device 104 are unreliable, based on a cost of the storage devices 104 being below a cost threshold or reliability threshold. In the depicted example, the cost threshold is 0.50. The storage devices 104A, 104B, and 104C have respective costs of 0.92, 0.73, and 0.86, which are above the cost threshold, and the reliability analyzer 208 accordingly determines that the storage devices 104A through 104B are reliable. The storage device 104D has a cost of 0.32, which is below the cost threshold, and the reliability analyzer 208 accordingly determines that the storage device 104D is unreliable and flags the storage device 104 as unreliable. The management device 102 may omit the flagged storage device 104D from consideration when implementing a pool-level selection process for selecting storage devices 104 as destination storage devices for writing data. The management device 102 may omit determining a rank for the storage device 104D because it is unreliable.

Figure 4:
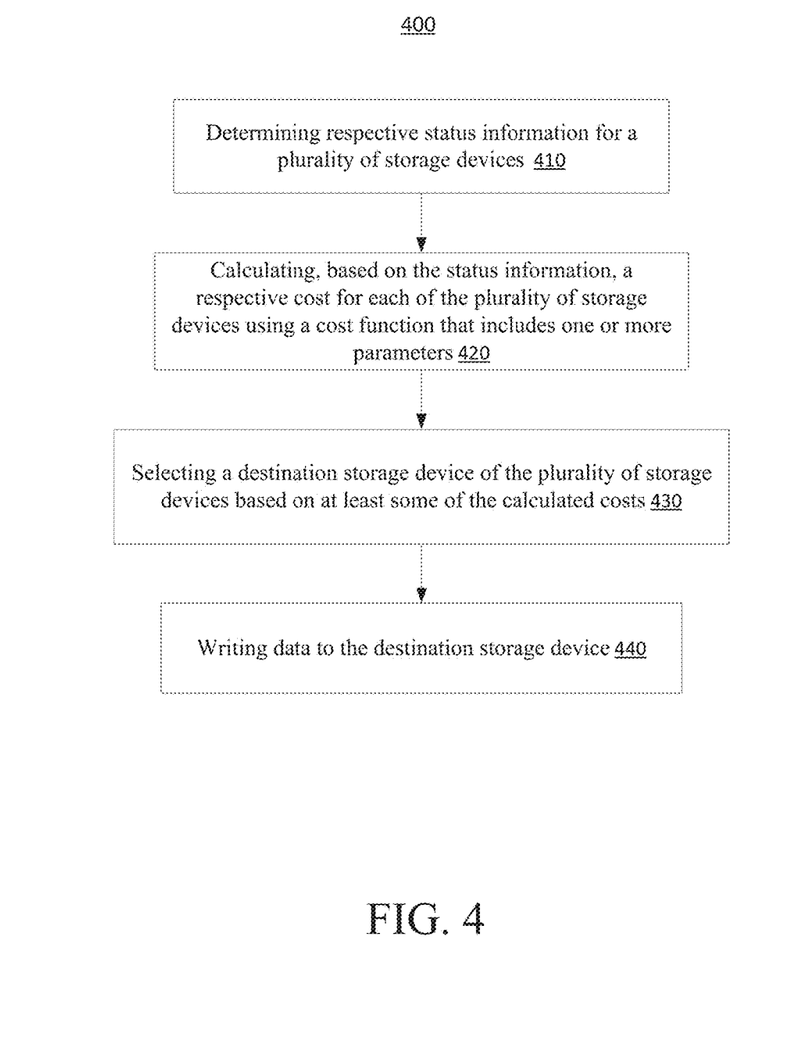
FIG. 4 is a flow chart showing an example method for writing data according to one or more embodiments of the present disclosure.

Referring now to FIG. 4, FIG. 4 shows an example method for writing data to a selected storage device according to embodiments of the present disclosure. The method includes blocks 410 through 450, and may be implemented using a storage system 100 as described herein. In brief summary, at block 410, a management device 102 of a storage system 100 determines respective status information 204 for a plurality of storage devices 104. At block 420, the management device 102 calculates, based on the status information 204, a respective cost for each of the plurality of storage devices 104 using a cost function that includes one or more parameters. At block 430, the management device 102 selects a destination storage device 104 of the plurality of storage devices 104 based on at least some of the calculated costs. At block 440, the management device 102 writes data to the destination storage device 104.

In more detail, at block 410, the management device 102 of the storage system 100 determines respective status information 204 for the plurality of storage devices 104. The management device 102 may use the status updater 210 to determine the status information 204. The status updater can determine the status information 204 according to a predetermined schedule (e.g. every twenty-four hours, or every fourth-eight hours), and/or can determine the status information 204 when a triggering event occurs (e.g. when data is newly archived in one or more of the storage devices 104, when one or more data migration processes are performed, when a storage device 104 is removed from, or added to, the pool of storage devices 104, or when a user of the management device 102 triggers a status update). The status updater 210 may be notified when a P/E cycle or an error correction process is performed on a storage device 104, or when a storage device 104 is otherwise accessed, and the status updater 210 updates the status information 204 accordingly. In some embodiments the status updater 210 can query the storage devices 104 (or a corresponding controller) for the status information 204. In some embodiments, the storage devices 104 (or a corresponding controller) may initiate a status update by transmitting statue information 204 to the status updater 210 without the status updater 210 requesting the information.

At block 420, the management device 102 calculates, based on the status information, a respective cost for each of the plurality of storage devices 104 using a cost function that includes one or more parameters. The management device 102 may calculate the costs using the cost calculator 206. The costs may indicate reliability, priority, or rank of the storage devices 104. The costs may indicate a suitability of the storage devices 104 for storing information (e.g. new information, or information being migrated from another storage device 104). The cost may indicate whether a storage device 104 is sufficiently reliable to include in a pool of reliable storage devices 104, or whether the storage device 104 should be flagged as unreliable, inactivated, and removed from the pool of reliable storage devices 104. The cost function used to calculate the costs may use as inputs any of PIE information 222, error information 224, workload information 226, or any other appropriate information. In some embodiments, the cost function is a linear function or includes a linear component. For example, the cost function may be of the form, or may include a term of the form:

$$\text{cost} = w_{P/E} \cdot P/E + w_{state} \cdot ES + w_{error} \cdot EL + w_{utilization} \cdot \text{WORK};$$

where P/E is a program/erase parameter, ES is an error state parameter, EL is an error level parameter, WORK is a workload parameter, and $w_{P/E}$, $w_{state}$, $w_{error}$, and $w_{work}$ are corresponding weights. The weights for the cost function can be predetermined weights. In some embodiments, the weights can be manually input by a user of the management device 102. In some embodiments, the weights can be determined by the management device 102.

At block 430, the management device 102 selects a destination storage device 104 of the plurality of storage devices 104 based on at least some of the calculated costs, and at block 440, the management device 102 writes data to the destination storage device 104. The management device 102 may select the destination storage device 104 and write the data to the destination storage device 104 using the migration manager 212. The migration manager 212 may implement a pool-level selection process that includes selecting a high priority storage device 104 as the destination storage device based on the cost of the storage device 104, or based on the ranking 220. In some embodiments the migration manager 212 may select the highest priority available storage device 104 of the pool of storage devise 104 as the destination storage device 104. An available storage device 104 may be, for example, a storage device 104 that has enough free memory to store the data to be transferred from the source storage device 104, or that is otherwise logistically suitable to store the transferred data.

Thus a storage system 100 can implement pool-level management of a plurality of storage devices 104 to store and/or migrate data. The storage system 100 provides for using storage devices, such as SSDs, that are expired or beyond a warranty point by implementing, among other things, improved selection and use of storage devices 104.

Figure 5:
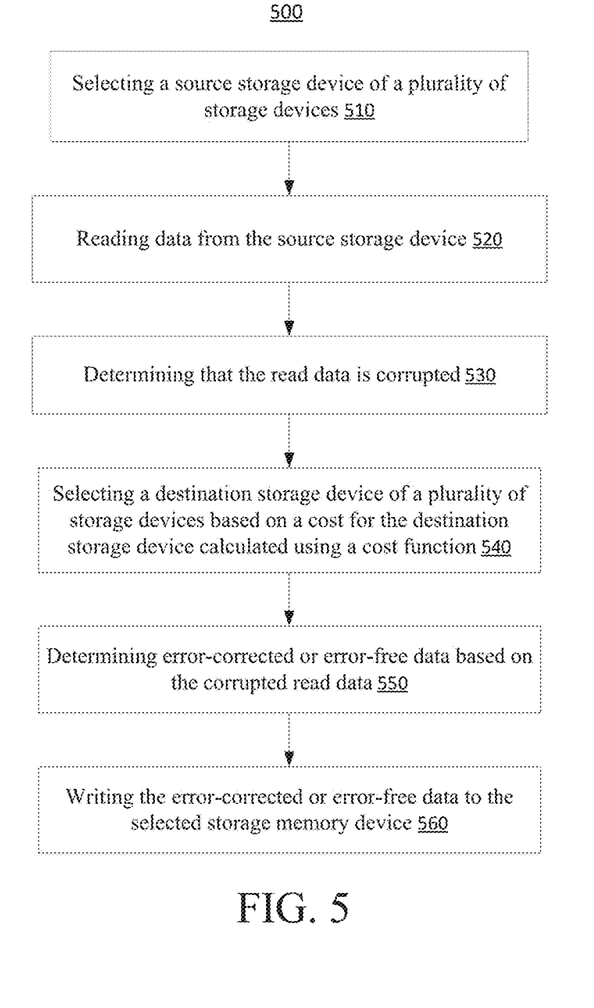
FIG. 5 is a flow chart showing an example method for writing error-corrected data according to one or more embodiments of the present disclosure.

Referring now to FIG. 5, FIG. 5 shows an example method for correcting and writing data to a selected storage device according to embodiments of the present disclosure. The method includes blocks 510 through 560, and may be implemented using a storage system 100 as described above. As a brief summary, at block 510, a management device 102 selects a source storage device 104 of a plurality of storage devices 104. At block 520, the management device 102 reads data from the source storage device 104. At block 530, the management device 102 determines that the read data is corrupted. At block 540, the management device 102 selects a destination storage device 104 of a plurality of storage devices 104 based on a cost for the destination storage device 104 calculated using a cost function. At block 550, the management device 102 determines error-free or error-corrected data based on the corrupted read data. At block 560, the management device 102 writes the error-free or the error-corrected data to the selected storage memory device 104.

In more detail, at block 510, the management device 102 selects the source storage device 104 of the plurality of storage devices 104. The management device 102 may select the storage device as part of a diagnostic protocol that includes periodically checking data stored on the plurality of storage devices 104, or the management device 102 may select the storage device responsive to receiving a request to read data from the source storage device 104.

At block 520, the management device 102 reads the data from the source storage device 104. At block 530, the management device 102 determines that the read data is corrupted. The management device 102 may determine that the read data is corrupted using an error checking technique such as a cyclic redundancy check (CRC), which may include a parity check. Alternatively, a storage device 104 itself may employ an Error Correcting Code (ECC) and/or CRC and report to the management device 102 an unrecoverable error or failure of the ECC, or a CRC check error.

At block 540, the management device 102 selects the destination storage device 104 of the plurality of storage devices 104 based on the cost for the destination storage device 104 calculated using the cost function. The management device 102 may select the destination storage device 104 using the migration manager 212. The migration manager 212 may implement a pool-level selection process that includes selecting a high priority storage device 104 as the destination storage device based on the cost of the storage device 104, or based on the ranking 220. In some embodiments the migration manager 212 may select the highest priority available storage device 104 of the pool of storage devise 104 as the destination storage device 104. An available storage device 104 may be, for example, a storage device 104 that has enough free memory to store the data to be transferred from the source storage device 104, or that is otherwise logistically suitable to store the transferred data.

At block 550, the management device 102 determines the error-free or error-corrected data based on the corrupted read data, and at block 560, the management device 102 writes the error-free or the error-corrected data to the selected storage memory device 104. The management device 102 may determine the error-free or the error-corrected data using an error manager 214. The error manager 214 may implement an ECC code or an erasure code protocol where data is encoded with redundancy into multiple data chunks before being stored as a stripe of chunks. The error manager 214 may read at least some of the data chunks, and may determine some chunks are corrupted and may proceed to read a sufficient number of chunks correctly in order to recover and read the data. The error manager 214 may determine that the corrupted data should be corrected, and may determine corresponding error-corrected data by implementing an ECC code. The management device 102 may then write the error-corrected data to the selected storage memory device 104.

Figure 6:
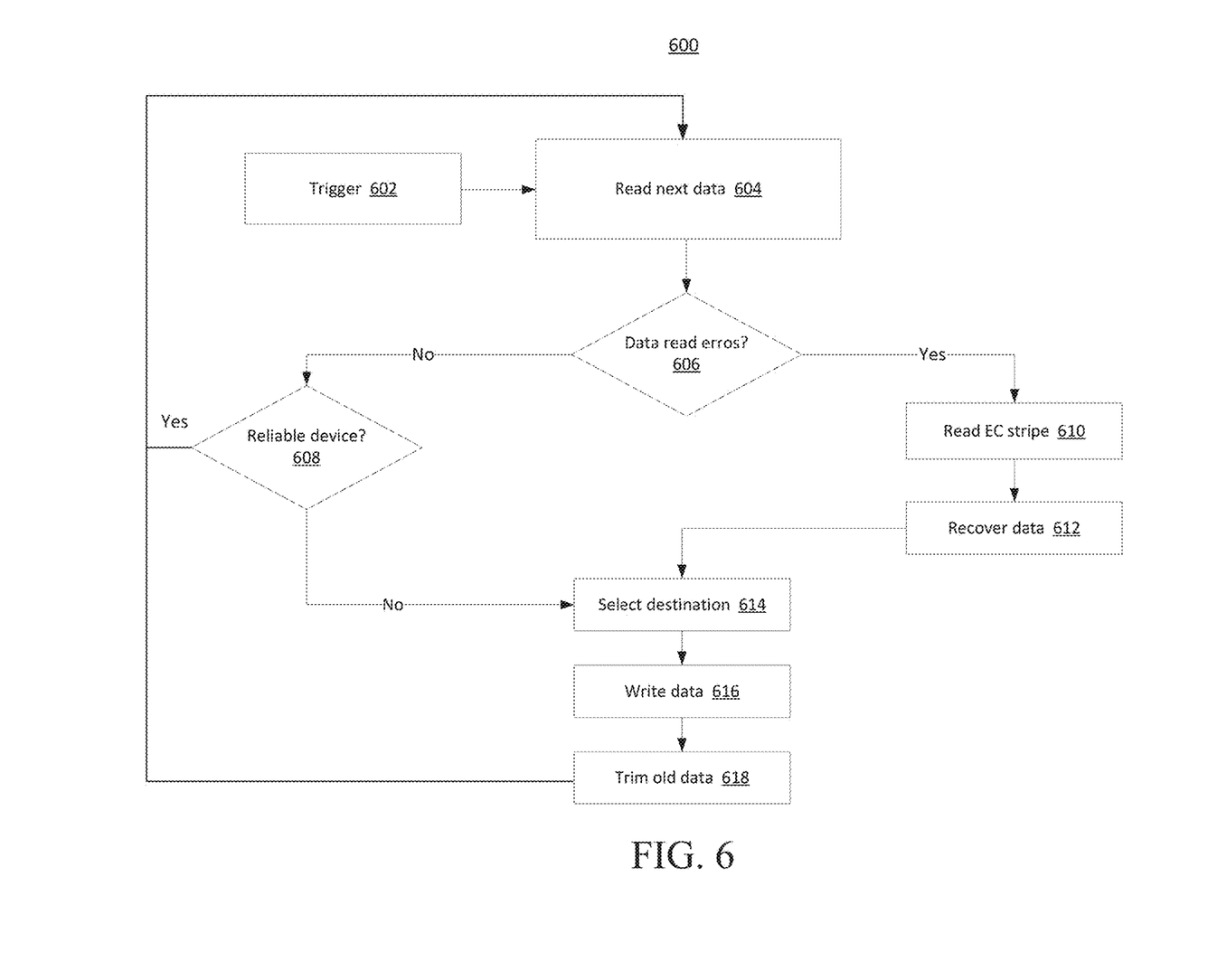
FIG. 6 is a flow chart showing an example method for performing system maintenance according to one or more embodiments of the present disclosure.

Referring now to FIG. 6, FIG. 6 shows an example method for performing system maintenance according to embodiments of the present disclosure. The method includes blocks 602 through 618, and can be performed using a storage system 100. In a brief overview, at block 602, a trigger occurs and initiates the method 600. At block 604, a management device 102 reads data from a storage device 104. At block 606, the management device 102 determines whether the read data includes errors. If the read data does not include errors, the method 600 proceeds to block 608. If the read data does include errors, the method 600 proceeds to block 610. At block 608, the management device 102 determines whether the storage device 104 from which the data was read is reliable. If so, the method 600 returns to block 604 (or, if all relevant data has been read, the method 600 ends). If the management device 102 determines that the storage device 104 from which the data was read is unreliable, the method proceeds to block 614.

At block 610, the management device 102 reads an erasure code stripe. At block 612, the management device 102 recovers the read data using sufficient data chunks read from the erasure code stripe. At block 614, the management device 102 selects a destination storage device 104. At block 616, the management device 102 writes the error-corrected data to the selected destination storage device 104. At block 618, the management device 102 trims the originally read data.

In more detail, at block 602, a trigger may initiate the method 600. The trigger may be a user instruction sent to the management device 102 to begin a general diagnostic process for the storage devices 104 or to begin an error checking process, or the trigger may be a determination by the management device 102 that it is time to being a scheduled diagnostic process.

At block 604, the management device 102 selects a storage device 104 and reads data from the storage device 104. The management device 102 may select the storage device 104 based on a diagnostic priority score or rank. In some embodiments, the diagnostic priority score is based on a cost of the storage device 104 (e.g. a lowest cost or closest-to-unreliable storage device 104 may have a high or highest diagnostic priority score).

At block 606, the management device 102 determines whether the read data includes errors or is corrupted using an error manager 214. The management device 102 may determine that the read data is includes errors using an error checking technique such as a cyclic redundancy check, which may include a parity check.

At block 608, the management device 102 determines whether the storage device 104 from which the data was read is a reliable device. The management device 102 may use a reliability analyzer 208 to make this determination, such as by comparing a cost of the storage device to a cost threshold.

At block 610 and at block 612, the management device 102 performs an error correction technique. For example, the error manager 214 may implement an erasure coding protocol that reads data of an erasure code stripe (EC stripe) in which data is encoded with redundancy into multiple data chunks. The error manager 214 may recover data using the EC stripe to determine error-free data that matches the original, uncorrupted read data.

At block 614, the management device 102 selects the destination storage device 104 of the plurality of storage devices 104 based on the cost for the destination storage device 104 calculated using the cost function. The management device 102 may select the destination storage device 104 using the migration manager 212. The migration manager 212 may implement a pool-level selection process that includes selecting a high priority storage device 104 as the destination storage device based on the cost of the storage device 104, or based on the ranking 220. In some embodiments the migration manager 212 may select the highest priority available storage device 104 of the pool of storage devise 104 as the destination storage device 104. An available storage device 104 may be, for example, a storage device 104 that has enough free memory to store the data to be transferred from the source storage device 104, or that is otherwise logistically suitable to store the transferred data. At block 616, the management device 102 writes the error-corrected data (or writes the read data, if it was determined at block 606 that error correction need not be implemented) to the selected storage device 104.

At block 618, the management device 102 may delete the read data from the storage device 104 read at block 604. Thus, an improved migration process is performed, and data can be transferred to a reliable storage device 604. Error correction may thus also be implemented as appropriate.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A method of managing data storage using a management device, comprising:
    determining respective status information for a plurality of storage devices, wherein the plurality of storage devices comprise at least one solid state drive (SSD);
    calculating, based on the status information, a respective cost for each SSD of the plurality of storage devices using a cost function that includes one or more SSD parameters including at least one of: a program/erase (P/E) parameter, a block error state parameter, and a block error level parameter;
    selecting a destination storage device of the plurality of storage devices based on at least some of the calculated costs; and
    writing data to the destination storage device.

2. The method of claim 1, further comprising performing a data migration process that comprises writing the data to the destination storage device, wherein the data is data to be migrated and is stored on a source storage device of the plurality of storage devices.

3. The method of claim 2, wherein the data migration process further comprises:
    selecting the source storage device for analysis;
    determining that the source storage device is not reliable; and
    determining to migrate the source storage device.

4. The method of claim 3, wherein determining that the source storage device is not reliable is based on determining that the calculated cost of the source storage device is at, above, or below a cost threshold.

5. The method of claim 2, wherein the data migration process is triggered according to a refresh protocol to reduce the likelihood of read disturb.

6. The method of claim 1, further comprising receiving, from an external device, a request to store the data, wherein selecting the destination storage device is performed responsive to receiving the request to store the data.

7. The method of claim 1, further comprising:
    selecting two or more destination storage devices of the plurality of storage devices including the storage device, based on the at least some of the calculated costs; and
    writing the data to the selected two or more destination storage devices.

8. The method of claim 1, further comprising determining a ranking for the plurality of storage devices based on the calculated costs, and wherein selecting the destination storage device comprises selecting the highest ranked storage device of the plurality of storage devices.

9. The method of claim 1, wherein determining the respective status information is performed responsive to a periodic trigger.

10. The method of claim 1, wherein the cost function includes one or more respective weights for the one or more parameters.

11. The method of claim 1, further comprising receiving a user input and determining the one or more respective weights based on the user input.

12. A system for managing data storage, comprising:
a plurality of storage devices; and
a management device configured to:
   determine respective status information for a plurality of storage devices, wherein the plurality of storage devices comprise at least one solid state drive (SSD);
   calculate, based on the status information, a respective cost for each SSD of the plurality of storage devices using a cost function;
   determine a ranking for the plurality of storage devices based on the calculated costs;
   select a destination storage device of the plurality of storage devices based on the ranking; and
   write data to the destination storage device,
wherein the cost function includes one or more SSD parameters including at least one of: a program/erase (P/E) parameter, a block error state parameter, and a block error level parameter.

13. The system of claim 12, wherein the management device is further configured to:
   determine that at least one of the plurality of storage devices is not reliable based on the corresponding calculated cost being at, above, or below a cost threshold; and
   flag the least one of the plurality of storage devices as not reliable.

14. The system of claim 13, wherein the management device is further configured to generate an alert that indicates that the flagged least one of the plurality of storage devices is not reliable.

15. The system of claim 12, wherein the management device is further configured to set respective weights for the one or more parameters of the cost function.

16. The system of claim 15, wherein the management device is further configured to perform error correction of the data written to the destination storage device.

17. A system for managing data storage, comprising:
a plurality of storage devices; and
a management device configured to:
   determine respective status information for a plurality of storage devices, wherein the plurality of storage devices comprise at least one solid state drive (SSD);
   calculate, based on the status information, a respective cost for each SSD of the plurality of storage devices using a cost function;
   determine a ranking for the plurality of storage devices based on the calculated costs;
   select a destination storage device of the plurality of storage devices based on the ranking; and
   write data to the destination storage device,
wherein the cost function includes one or more parameters including at least one of: a program/erase (P/E) parameter, a block error state parameter, a block error level parameter, and a workload parameter, and
wherein the management device is further configured to:
determine that at least one SSD of the plurality of storage devices is not reliable based on the corresponding calculated cost being at, above, or below a cost threshold; and
flag the least one SSD of the plurality of storage devices as not reliable.

* * * * *